United States Patent
Nakamura et al.

(10) Patent No.: US 10,554,217 B2
(45) Date of Patent: Feb. 4, 2020

(54) SENSOR TERMINAL AND SENSOR SYSTEM

(71) Applicant: HITACHI, LTD., Tokyo (JP)

(72) Inventors: Yohei Nakamura, Tokyo (JP); Taizo Yamawaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/225,790

(22) Filed: Dec. 19, 2018

(65) Prior Publication Data

US 2019/0199366 A1    Jun. 27, 2019

(30) Foreign Application Priority Data

Dec. 26, 2017  (JP) .................................. 2017-249146

(51) Int. Cl.
| | |
|---|---|
| *H03M 1/12* | (2006.01) |
| *G08C 15/06* | (2006.01) |
| *H04Q 9/00* | (2006.01) |
| *G01D 3/02* | (2006.01) |
| *G01R 19/25* | (2006.01) |

(52) U.S. Cl.
CPC .............. *H03M 1/12* (2013.01); *G01D 3/022* (2013.01); *G01R 19/25* (2013.01); *G08C 15/06* (2013.01); *H04Q 9/00* (2013.01)

(58) Field of Classification Search
CPC ........................................................ H03M 1/12
USPC ........................................................... 341/155
See application file for complete search history.

(56) References Cited

U.S. PATENT DOCUMENTS

2003/0076250 A1* 4/2003 Enochson ............. H03M 1/004
341/120

FOREIGN PATENT DOCUMENTS

JP          2015-103062 A     11/2013

* cited by examiner

*Primary Examiner* — Peguy Jean Pierre

(74) *Attorney, Agent, or Firm* — Volpe and Koenig, P.C.

(57) ABSTRACT

Provided is a sensor terminal including a sensor element, the sensor terminal further including: an ADC that converts an analog signal output from a sensor element into a digital signal; a storage device in which a plurality of first storage setting numbers being information for controlling the ADC and a plurality of pieces of first characteristic information including description of operation of the ADC are stored in association with each other; and a communication device that receives a first reception setting number from the outside of the sensor terminal, and transmits the first characteristic information corresponding to the first storage setting number that coincides with the first reception setting number, to the outside of the sensor terminal.

13 Claims, 8 Drawing Sheets

FIG. 2A

| ITEM NUMBER 211 | ITEM NAME 212 | EXPLANATION OF ITEM 213 | DEPENDENT ITEM 214 | DEPENDENT TYPE 215 | NUMBER OF SETTING NUMBERS 216 |
|---|---|---|---|---|---|
| (11) | BANDWIDTH | xxxx | (12) | CHANGE | x |
| (12) | RESOLUTION | yyyy | — | INDEPENDENT | y |
| (13) | SAMPLING RATE | zzzz | (12) | CONSTRAINT | z |
| ⋮ | ⋮ | ⋮ | ⋮ | ⋮ | ⋮ |

FIG. 2B

| SETTING NUMBER 221 | RESOLUTION 222 |
|---|---|
| (21) | 8bit |
| (22) | 9bit |
| (23) | 10bit |
| ⋮ | ⋮ |

FIG. 2C

| RESOLUTION 231 | BANDWIDTH 232 | | | | RESPONSE 234 |
|---|---|---|---|---|---|
| | (31) 233 | (32) | ⋯ | (3n) | |
| (21) | 100KHz | 200KHz | ⋯ | 100MHz | 10msec |
| (22) | 50KHz | 100KHz | ⋯ | 50MHz | |
| ⋮ | ⋮ | ⋮ | ⋮ | ⋮ | |

FIG. 2D

| RESOLUTION | SAMPLING RATE | | |
|---|---|---|---|
| | min. | max. | ... |
| (21) | (41) | (49) | ... |
| (22) | (41) | (48) | ... |
| (23) | (42) | (46) | ... |
| ⋮ | ⋮ | ⋮ | ⋮ |

| RESOLUTION | BANDWIDTH | | |
|---|---|---|---|
| | (31) | (32) | ... |
| (21) | 1μW | 2μW | ... |
| (22) | 4μW | 8μW | ... |
| (23) | 16μW | 32μW | ... |
| ⋮ | ⋮ | ⋮ | ⋮ |

251, 252, 253

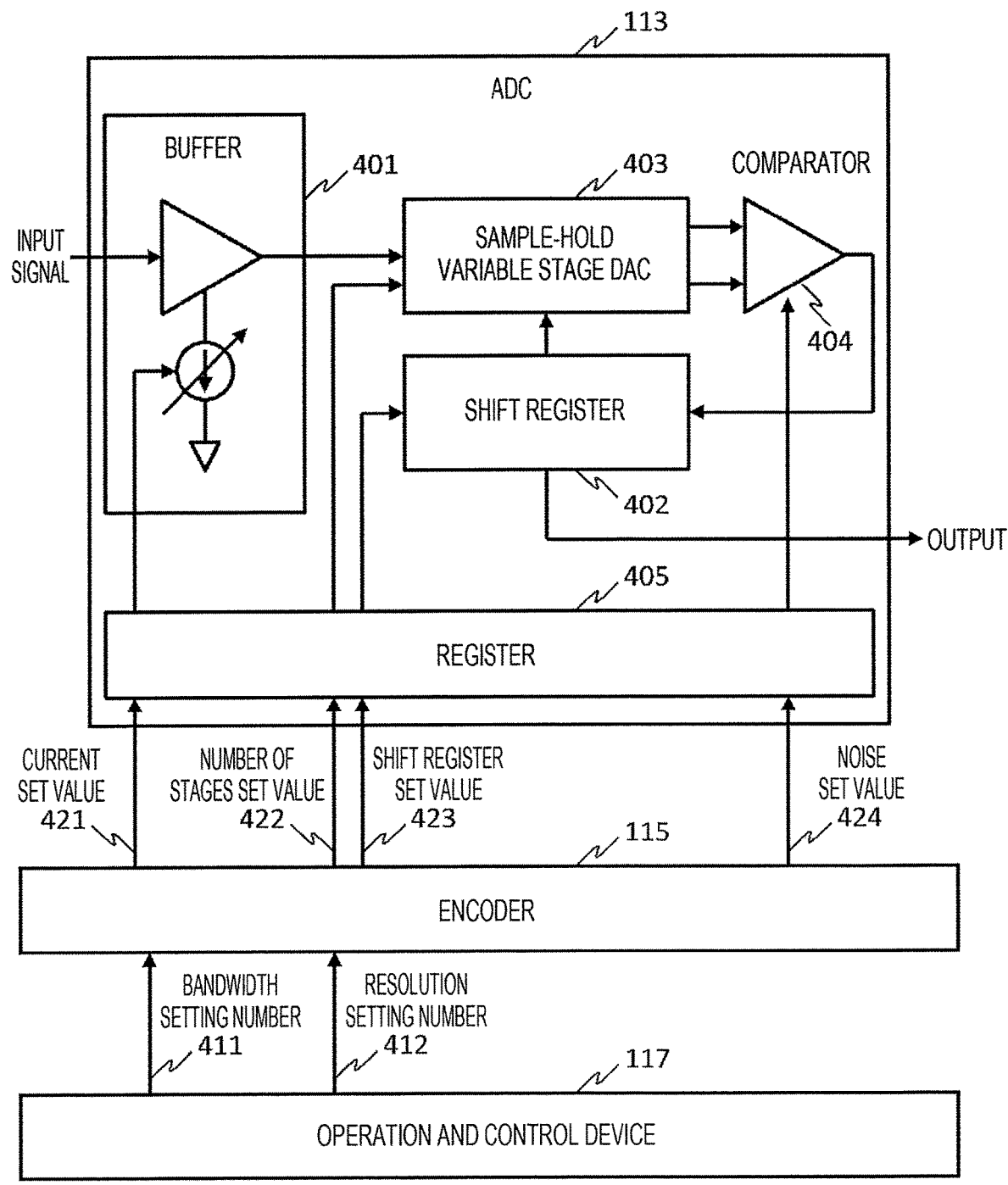

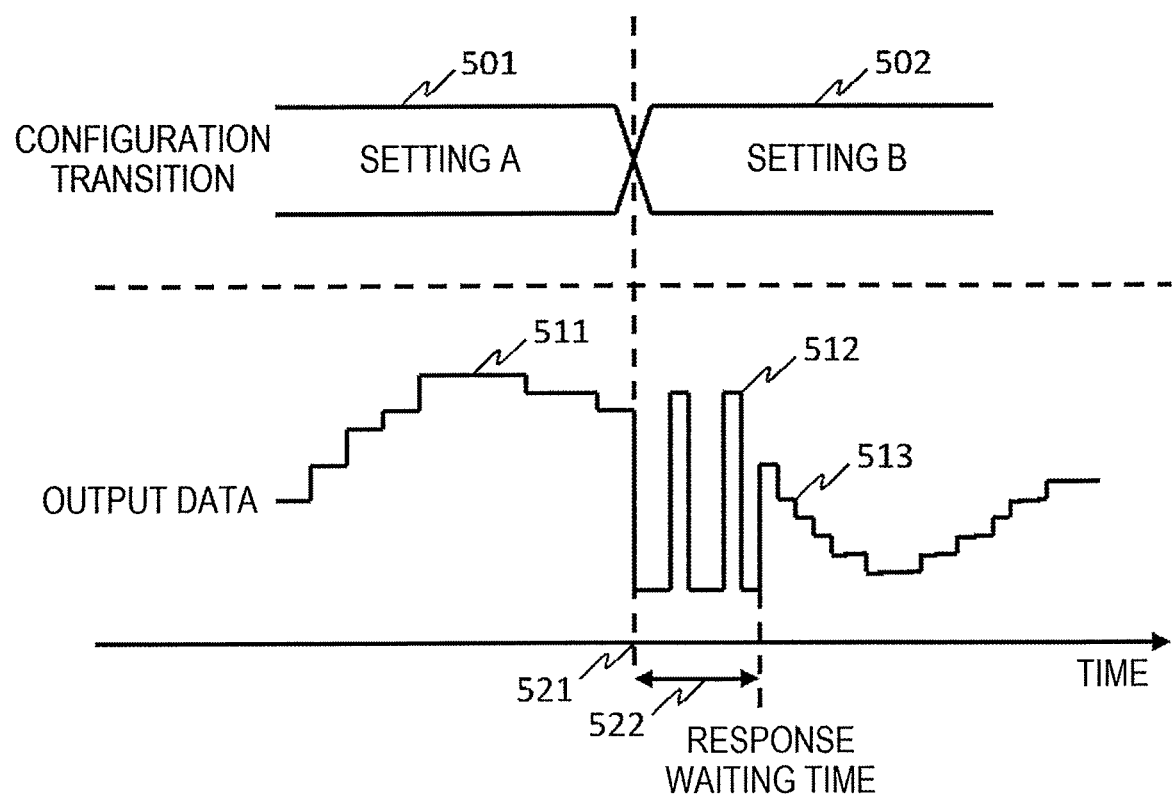

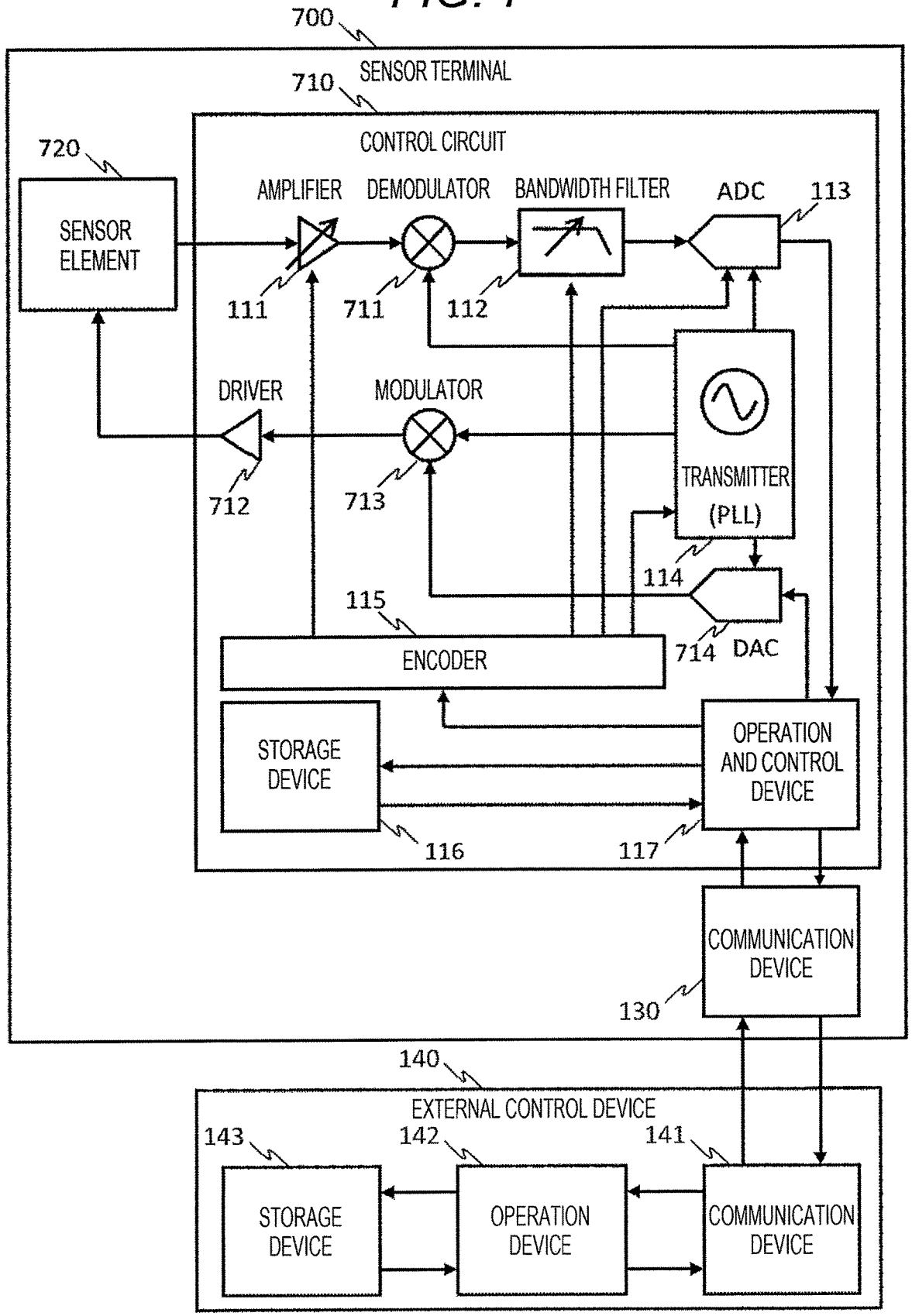

SENSOR TERMINAL AND SENSOR SYSTEM

BACKGROUND OF THE INVENTION

1. Field of the Invention

The present invention relates to a sensor terminal and a sensor system.

2. Description of the Related Art

It is expected that a plurality of sensor terminals are arranged in a facility of a factory or the like, and data obtained from the sensor terminals is analyzed so that failure prediction and an optimum operation method are obtained. With mass information gathered from such sensor terminals, although the state of the facility is classified and detected by using a machine learning method or the like, at the initial stage of installation, it is often not clear what kind of information obtained from the sensor terminals plays a fatal role in the detection.

In such a case, the sensor terminal is required to have excessive performance with respect to inherently necessary performance, and the operation cost increases due to an increase in data rate and an increase in power consumption. Even if redesigned sensor terminals are rearranged at the stage where the optimum performance is found out, cost for rearranging a large number of sensor terminals is required.

Therefore, use of a sensor terminal capable of changing characteristics of performance even after installation of sensor terminals has been proposed. For example, JP 2015-103062 A provides a means for switching a gain or the like of a circuit in a sensor terminal on the basis of information of a setting table stored in advance in a storage device included in a data collection device (control unit).

SUMMARY OF THE INVENTION

By using the means provided in JP 2015-103062 A, characteristics can be changed after installation of the sensor terminal. However, in a case where many types of sensor terminals are installed in a mixed manner, it requires complicated work such as associating the information that can be set, while checking the type of the device, for collectively managing information of characteristics that vary depending on the types of sensor terminals before installation, by a device that sets information.

The present invention provides a means for sharing information that can be set to a sensor terminal, between the sensor terminal and the outside of the center terminal so that information can be set to the sensor terminal even when the sensor terminal has already been installed.

A typical sensor terminal according to the present invention is a sensor terminal including a sensor element, the sensor terminal including: an ADC that converts an analog signal output from a sensor element into a digital signal; a storage device in which a plurality of first storage setting numbers being information for controlling the ADC and a plurality of Pieces of first characteristic information including description of operation of the ADC are stored in association with each other; and a communication device that receives a first reception setting number from the outside of the sensor terminal and transmits the first characteristic information corresponding to the first storage setting number that coincides with the first reception setting number to the outside of the sensor terminal.

According to the present invention, it is possible to provide a means for sharing information that can be set to a sensor terminal, between the sensor terminal and the outside of the center terminal so that information can be set to the sensor terminal even when the sensor terminal has already been installed.

BRIEF DESCRIPTION OF THE DRAWINGS

FIG. 2A is a diagram showing an example of a characteristic table common to a plurality of items;

FIG. 2B is a diagram showing an example of a characteristic table of an independent type item;

FIG. 2C is a diagram showing an example of a characteristic table of a change type item;

FIG. 2D is a diagram showing an example of a characteristic table of a constraint type item;

FIG. 2E is a diagram showing another example of a characteristic table of a change type item;

FIG. 4 is a diagram showing an example of a circuit related to an ADC;

FIG. 5 is a diagram showing an example of a response waiting time required at setting change;

FIG. 7 is a diagram showing an example of a sensor system for calibrating contents of a characteristic table.

DESCRIPTION OF THE PREFERRED EMBODIMENTS

Preferred embodiments of the present invention will be described below as examples with reference to the drawings.

First Embodiment

Figure 1:
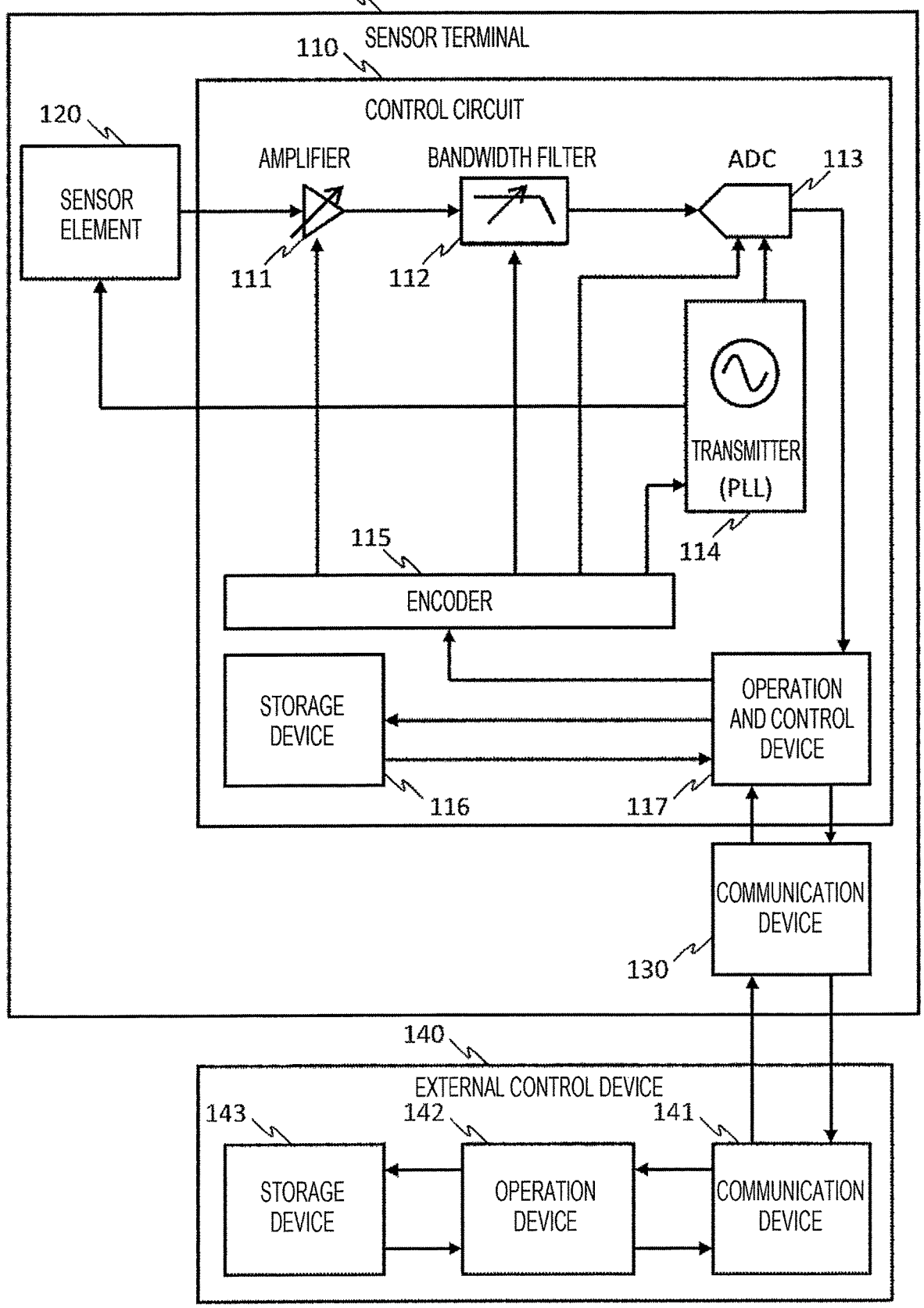
FIG. 1 is a diagram showing an example of a sensor system.

FIG. 1 shows an example of a sensor system including a sensor terminal 100 and an external control device 140 according to a first embodiment. The sensor terminal 100 is a sensor terminal including a performance variable sensor whose characteristics can be changed by external setting, and a storage device that stores a set value of the setting. Each circuit of the sensor terminal 100 will be described below.

A sensor element 120 is an element that converts a physical signal (physical phenomenon) into an electric signal, and a type of the physical signal that is to be converted by the sensor element 120 is not limited. However, it is preferable that the sensor element 120 is an element that converts a physical signal into an electric signal having a bandwidth. Also, it is preferable that the converted electric signal is an analog signal.

An amplifier 111 is a circuit that amplifies the electric signal from the sensor element 120, and may amplify the electric signal to a value necessary for an ADC 113 in the subsequent stage, for example. A bandwidth filter 112 is a circuit that limits a frequency bandwidth of the electric signal amplified by the amplifier 111, and may be, for example, a low pass filter, a band pass filter, or a high pass filter.

An analog-to-digital converter (ADC) 113 is a circuit that converts an analog electric signal into a digital electric signal. The ADC 113 will be further described later with reference to FIG. 4. A transmitter 114 is a circuit that supplies a clock to each circuit in the sensor terminal 100, and may be, for example, a phase locked loop (PLL) circuit.

The sensor element 120 may acquire a physical signal or output an analog electric signal in accordance with a clock from the transmitter 114. The ADC 113 may acquire an analog electric signal or output a digital electric signal in accordance with a clock from the transmitter 114.

Due to such operation based on the clock, the output of the sensor element 120 and the input of the ADC 113 may be synchronized with each other. It should noted that the sensor element 120 may continuously acquire a physical signal and continuously output an analog electric signal without an input of a clock.

The operation and control device 117 is a circuit that controls each circuit in the sensor terminal 100. The operation and control device 117 outputs a signal to an encoder 115 on the basis of characteristic data read from the storage device 116, transmits a digital electric signal from the ADC 113 to the outside via a communication device 130, and writes data externally received via the communication device 130 into the storage device.

The storage device 116 is a circuit that stores tabulated variable characteristics (characteristic table) as data. The tabulated variable characteristic will be further described later with reference to FIGS. 2A to 2E. The encoder 115 receives a characteristic setting signal from the operation and control device 117 and outputs a register value of each circuit corresponding to the characteristic setting signal to each circuit.

The amplifier 111, the bandwidth filter 112, the ADC 113, the transmitter 114, the encoder 115, the storage device 116, and the operation and control device 117 compose the control circuit 110 for the sensor element 120.

The communication device 130 is a circuit that communicates with the outside of the sensor terminal 100. The sensor element 120, the control circuit 110, and the communication device 130 described above compose the sensor terminal 100.

With respect to the sensor terminal 100 described above, the external control device 140 includes a communication device 141 that communicates with the sensor terminal 100, an operation circuit 142 that operates on the basis of a communication result transmitted from the sensor terminal 100, and determines communication contents, and a storage device 143 that stores the characteristic table of the sensor transmitted by the sensor terminal 100.

The external control device 140 receives, in addition to the signal converted by the ADC 113 from the sensor terminal 100, the characteristic table stored in the storage device 116 of the sensor terminal 100, and stores the received characteristic table to the storage device 143 of the external control device 140, so that the characteristic table stored in the sensor terminal 100 can be shared with the external control device 140.

Although FIG. 1 shows an example in which one sensor terminal 100 and one external control device 140 are connected, a plurality of sensor terminals 100 and one external control device 140 may be connected. In order to identify the plurality of sensor terminals 100, identifiers may be assigned to each of the plurality of sensor terminals 100.

FIGS. 2A to 2E show examples of characteristic tables stored in the storage device 116. FIG. 2A is a diagram showing an example of a characteristic table that summarizes a plurality of items whose characteristics can be changed. An item number 211 is a number for identifying the item, and information on the item identified by the item number 211 is arranged from an item name 212 to the number of setting numbers 216. Therefore, the characteristic table shown in FIG. 2A is also item information.

"(11)" of the item number 211 in the example of FIG. 2A and the like are numbers for explanation, and parentheses are added so that the numbers are easily distinguished from reference numerals. However, it is not limited to such numbers, as long as it is information that can identify items. An item name 212 is the name of the item, and explanation of item 213 is information for explaining the contents of the item. In the example of FIG. 2A, "xxxx" in the explanation of item 213 and the like are information of arbitrary character strings, and particular contents thereof are omitted.

A dependent item 214 is a number for identifying an item that is a dependency destination, and corresponds to the number of the item number 211. For example, the dependent item 214 of the item whose item number 211 is "(11)" and the item name 212 is "bandwidth" is "(12)", and this represents that the item number 211 is "(12)" and the item name 212 depends on the item of "resolution".

The dependent item 214 may be information that there is no dependency destination item, and in the example of FIG. 2A, it is represented by "-". The dependent type 215 is information representing "chance" indicating that the characteristic changes according to the setting of the item of the dependent item 214 even if the setting is not changed, "constraint" indicating that the range that can be set is constrained according to the setting of the item of the dependent item 214, and "independent" indicating that it is not influenced by setting of other items.

It should be noted that an example in the case where the dependent item 214 is "independent", "change", and "constraint" will be described with reference to each of FIGS. 2B to 2D. The dependent item 214 may be information other than these items. The number of setting numbers 216 is the total number of types of setting information that can be set in the one item, that is, the total number of types of setting information (setting number) that the encoder 115 can accept for one item. This will also be described with reference to FIGS. 2B to 2D.

FIG. 2B is a diagram showing an example of a characteristic table of items having no influence from other item setting, that is, an example of a characteristic table in which the dependent type 215 is "independent". Among such characteristic tables, the example in FIG. 2B is an example of a characteristic table in which the item number 211 is "(12)" and the item name 212 is "resolution" shown in FIG. 2A.

Therefore, although it is unnecessary for the contents itself of the characteristic table shown in FIG. 2B, in order to identify the characteristic table shown in FIG. 2B, management information indicating the characteristic table whose item number 211 is "(12)" may be present somewhere.

The setting number 221 is a number (information) set in the encoder 115. "(21)" of the setting number 221 and the like are also numbers for explanation, parentheses are added so that the numbers are easily distinguished from reference numerals, and the different number from the item number 211 is added. However, it is not limited to such numbers, as long as it is information that can identify setting numbers for items.

The resolution 222 is a characteristic to be expressed in the control circuit 110 with respect to the number of the setting number 221. For example, when "(21)" of the setting number 221 is set in the encoder 115, the resolution with respect to a signal is "8 bits" in the control circuit 110 or in some circuits in the control circuit 110.

The number of setting numbers 216 for the example of the characteristic table shown in FIG. 2S is the number of the setting numbers 221. That is, although the number is not limited to three in FIG. 2B, for example, if the setting number 221 is three, that is, "(21)", "(22)" and "(23)", "y" of the number of setting numbers 216 shown in FIG. 2A is 3.

FIG. 2C is a diagram showing an example of a characteristic table in which a characteristic to be expressed varies even if the setting is not changed, in accordance with setting of a dependency destination item, that is, a characteristic table in which the dependent type 215 is "change". Among such characteristic tables, the example in FIG. 2C is an example of a characteristic table in which the item number 211 is "(11)" and the item name 212 is "bandwidth" shown in FIG. 2A.

Therefore, although it is unnecessary for the contents itself of the characteristic table shown in FIG. 2C, in order to identify the characteristic table shown in FIG. 2C, management information indicating the characteristic table whose item number 211 is "(11)" may be present somewhere.

The bandwidth 232 is a characteristic to be expressed in the control circuit 110 with respect to the number of the bandwidth setting number 233. For example, when "(31)" of the setting number 233 is set in the encoder 115, the bandwidth with respect to a signal is "100 KHz" or the like in the control circuit 110 or in some circuits in the control circuit 110.

In the example of FIG. 2C, the bandwidth setting number 233 is "(31)", and "(32)" to "(3n)". However, this number is also a number for explanation and the number is not limited to such numbers. The number of setting numbers 216 for the example of the characteristic table shown in FIG. 2C is the number of the setting numbers 233, and if the number of the setting numbers 233 is n, "x" of the number of setting numbers 216 shown in FIG. 2A is n.

As shown in FIG. 2A, since the dependent type 215 is "change" and the dependent item 214 is "(12)", the correspondence information between the resolution setting number 231 and the bandwidth 232 is stored in the characteristic table. The number of the resolution setting number 231 is the number of the setting number 221 shown in FIG. 2B.

Therefore, even if the bandwidth setting number 233 is fixed to "(31)", if the resolution setting number 231 is "(21)", the bandwidth in the control circuit 110 is "100 KHz", while, if the resolution setting number 231 is "(22)", the bandwidth in the control circuit 110 is "50 KHz".

A response 234 is waiting time for a response from when the number of the bandwidth setting number 233 or the resolution setting number 231 is changed by the encoder 115 until the characteristic to be expressed in the control circuit 110 chances.

FIG. 2D is a diagram showing an example of a characteristic table in which the range that can be set is constrained in accordance with setting of a dependency destination item, that is, an example of a characteristic table in which the dependent item 214 is "constraint". Among such characteristic tables, the example in FIG. 2D is an example of a characteristic table in which the item number 211 is "(13)" and the item name 212 is "sampling rate" shown in FIG. 2A.

Therefore, although it is unnecessary for the contents itself of the characteristic table shown in FIG. 2D, in order to identify the characteristic table shown in FIG. 2D, management information indicating the characteristic table whose item number 211 is "(13)" may be present somewhere.

The sampling rate 242 is constraint on the sampling rate setting number. However, as shown in FIG. 2A, since the dependent type 215 is "constraint" and the dependent item 214 is "(12)", the correspondence information between the resolution setting number 241 and the sampling rate 242 is stored in the characteristic table. The number of the resolution setting number 241 is the number of the setting number 221 shown in FIG. 2B.

Therefore, the sampling rate setting number 243 set in the encoder 115 is the number from "(41)" to "(49)". However, if the resolution setting number 241 is "(22)", the settable minimum value of the sampling rate setting number is "(41)" and the settable maximum value is "(48)".

If the resolution setting number 241 is "(23)", the settable minimum value of the sampling rate setting number is "(42)" and the maximum value is "(46)". It should be noted that the constraint is not limited to the minimum value and the maximum value, and settable numbers may be listed, or numbers that are not settable may be listed.

The number of setting numbers 216 for the example of the characteristic table shown in FIG. 2D is the number of the types of the setting number 243. That is, if the setting number 243 is nine, that is, "(41)" to "(49)", "z" of the number of setting numbers 216 shown in FIG. 2A is nine.

In the example shown in FIG. 2D, the sampling rate 242 is set to the setting number 243. However, for the sampling rate, since the value of the sampling rate corresponds to the setting number in a one-to-one manner, and the magnitude of the value of the sampling rate and the magnitude of the setting number correspond to each other, the setting number 243 may be regarded as the value itself of the sampling rate.

FIG. 2E is a diagram showing another example of the characteristic table in which the dependent type 215 is "change". In the example shown in FIG. 2C, described is the characteristic table in which the characteristic of the item of the setting number 233 changes on the basis of the setting number 231 and the setting number 233. However, in the example shown in FIG. 2E, described is a characteristic table in which a characteristic that is not either the item of the setting number 251 or the item of the setting number 252 changes on the basis of the setting number 251 and the setting number 252.

"(21)" and the like that are the numbers of the resolution setting number 251 are numbers of the setting number 221 shown in FIG. 2B, and "(31)" and the like that are the numbers of the bandwidth setting number 252 are numbers of the setting number 233 shown in FIG. 2C. For these resolution and bandwidth, "16 µW" of power consumption 253 is a characteristic to be expressed in the control circuit 110 even if there is no item for which Power consumption is set.

In the example of FIG. 2E, when the resolution setting number 251 is "(21)" and the bandwidth setting number 252 is "(31)", the power consumption 253 is "1 µW". However, when the resolution setting number 251 is changed to "(22)", the power consumption 253 is "4 µW", and when the bandwidth setting number 252 is changed to "(32)", the power consumption 253 is "2 µW".

Among the characteristic tables shown in FIGS. 2B to 2E described above, the characteristic table shown in FIG. 2C includes the response 234. However, for other characteristics, if waiting time for a response occurs after the setting number is changed by the encoder 115 and until the characteristic to be expressed in the control circuit 110 changes, other characteristics tables may include information on waiting time for a response.

In addition, in the explanation of FIGS. 2A to 2E, in order to make correspondence of numbers easy to understand, the item number 211 is set to "(11)" or the like, the resolution setting number 221 is set to "(21)" or the like, and the bandwidth setting number 233 is set to "(31)" or the like, so that they are distinguished from each other. However, among the item number 211, the setting number 221, and the setting number 233, the value of the number itself may be the same or different.

For example, they may be the same or different as long as "(21)", "(22)" and "(23)" of the setting number 221 have values of different numbers. The value itself of the number such as the setting number 221 may be a value based on information stored in the circuit of the encoder 115 that defines the input of the encoder 115 or the encoder 115.

Figure 3A:
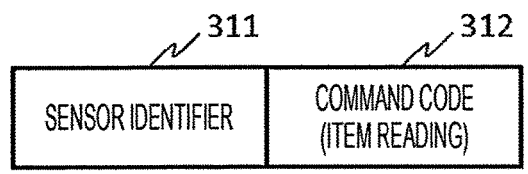
FIG. 3A is a diagram showing an example of a telegram for reading an item.
Figure 3B:
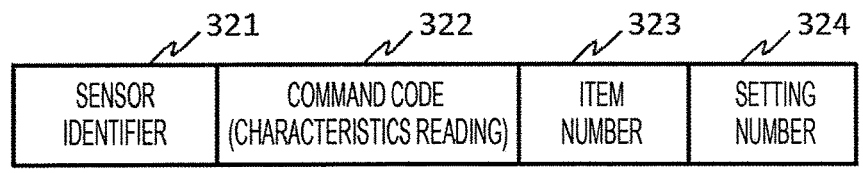
FIG. 3B is a diagram showing an example of a telegram for reading characteristics of an independent type item.
Figure 3C:
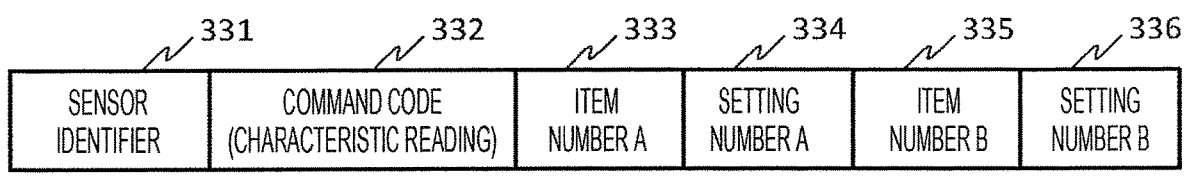
FIG. 3C is a diagram showing an example of a telegram for reading characteristics of a change type item.

FIGS. 3A to 3C are examples of telegrams to be transmitted when the external control device 140 reads the characteristics from the sensor terminal 100. When the item information of the characteristic table of the specific sensor terminal 100 is read from the plurality of sensor terminals 100, as shown in FIG. 3A, the transmitted telegram includes a sensor identifier 311 for specifying the sensor terminal 100 and a command code 312 for reading the item.

Upon receiving the telegram shown in FIG. 3A, the sensor terminal 100 determines that the sensor identifier 311 is the identifier of its own sensor terminal, determines that the command code 312 is item reading, and returns the item information of the characteristic table shown in FIG. 2A to the external control device 140. As a result, the item number and the number of setting numbers corresponding to each item are shared between the sensor terminal 100 and the external control device 140.

The external control device 140 reads the information of the characteristic table shown in FIGS. 2B to 2E from the sensor terminal 100. The external control device 140 may read a plurality of pieces of information with one telegram or may read one piece of information. Hereinafter, an example in which one piece of information is read with one telegram will be described. When a plurality pieces of information are read, a plurality of telegrams are transmitted.

When the dependent type 215 of the item to be read is "independent", as shown in FIG. 3B, the external control device 140 transmits a telegram including a sensor identifier 321, a command code to read characteristics 322, an item number 323, and a setting number 324 to the sensor terminal 100.

When the dependent type 215 of the item to be read is "change", as shown in FIG. 3C, the external control device 140 transmits a telegram including a sensor identifier 331, a command code to read characteristics 332, an item number A333, a setting number A334, an item number B335, and a setting number B336 to the sensor terminal 100.

Here, the item number B335 is the item on which the item number A333 depends and is the item number of the dependent item 214. When the number of dependency destination items is two or more, the telegram may further include an item number and a setting number.

As an explanation, in order to determine a position to which an item number and a setting number belong, the item number and the setting number stored in the storage device 116 or the storage device 143 may be referred to as a storage item number and a storage setting number, respectively, the transmitted item number and the setting number may be referred to as a transmission item number and a transmission setting number, respectively, and the received item number and setting number may be referred to as a reception item number and a reception setting number, respectively.

FIG. 4 is a diagram showing an example of a circuit related to the ADC 113. The ADC 113 is a successive approximation analog-to-digital converter with variable performance. A buffer 401 is a circuit that amplifies an analog input signal and is an amplifier circuit whose bandwidth is variable by current setting.

A sample-hold variable stage DAC 403 sample-holds the analog signal amplified by the buffer 401, outputs the result to a comparator 404, converts the digital value from a shift register 402 into an analog signal, and outputs the analog signal to the comparator 404. Here, the number of bits of the digital value from the shift register 402, that is, the number of bits converted into an analog signal is set as the number of stages.

The comparator 404 compares the magnitudes of the voltages of the two analog signals and outputs the comparison result. Since the analog signal includes a noise component, the value of the noise is set so that the margin of the noise component is provided and the voltages are compared.

An initial value is set to each bit of the shift register 402, and the shift register 402 sequentially updates bit by bit from a most significant bit (MSB) to a least significant bit (LSB) with the comparison result of the comparator 404.

The shift register 402 outputs, as digital values, the bits from the MSB to the LSB updated by 1 bit with the comparison result to the sample-hold variable stage DAC 403, and when updating is performed with the comparison result to the LSB, outputs a digital value of hits from the MSB to the LSB to the outside of the ADC 113 as digital signals.

The ADC 113 includes a register 405 for holding values output to each of the buffer 401, the shift register 402, the sample-hold variable stage DAC 403, and the comparator 404. The value held in the register 405 is received from the encoder 115.

The encoder 115 receives the setting number from the operation and control device 117 and encodes the received setting number into the set value of the register 405. The bandwidth setting number 411 is the number of the setting number 233 of the bandwidth shown in FIG. 2C, and the resolution setting number 412 is the number of the setting number 221 of the resolution shown in FIG. 2B.

When the operation and control device 117 outputs the resolution setting number 412 to the encoder 115, the encoder 115 outputs the number of stages set value 422 and the shift register set value 423 to the register 405 such that the ADC 113 is the characteristic of the resolution corresponding to the setting number. Here, the encoder 115 may output a noise set value 424 corresponding to the resolution.

When the operation and control device 117 outputs the bandwidth setting number 411 to the encoder 115, since the bandwidth also depends on the resolution, the encoder 115 outputs the current set value 421 to the register 405 such that the ADC 113 is the characteristic of the bandwidth corresponding to the setting number of the bandwidth and the resolution.

Although the ADC 113 is shown as the output destination of the encoder 115 with respect to the bandwidth setting number 411 in FIG. 4, since the bandwidth filter 112 is also included in the circuit for limiting the frequency bandwidth as described above, the bandwidth filter 112 may be included as an output destination of the encoder 115 with respect to the bandwidth setting number 411. As described above, the encoder 115 may hold a look-up table for the purpose of encoding from the setting number to the set value.

FIG. 5 is a diagram showing an example of response waiting time required at setting change that has been described with reference to FIG. 2C. When setting A501 is changed to another setting B502 as a configuration transition of the sensor terminal 100, the response waiting time includes the delay time until the encoder 115 encodes to the set value and rewrites the register 405, the time after the register 405 is rewritten until the output of the circuit becomes stable, and the like.

That is, when changing is performed to the setting B502 at the time 521 in a case where the data 511 corresponding to the setting A501 is output, after unstable data 512 is output, data 513 corresponding to the setting B502 is output, and time 522 at which the unstable data 512 is output is the response waiting time.

The external control device 140 includes the response waiting time in the characteristic table and shares with the sensor terminal 100, thereby capable of specifying time-valid data and invalid data along with change of the sensor terminal 100.

Figure 6A:
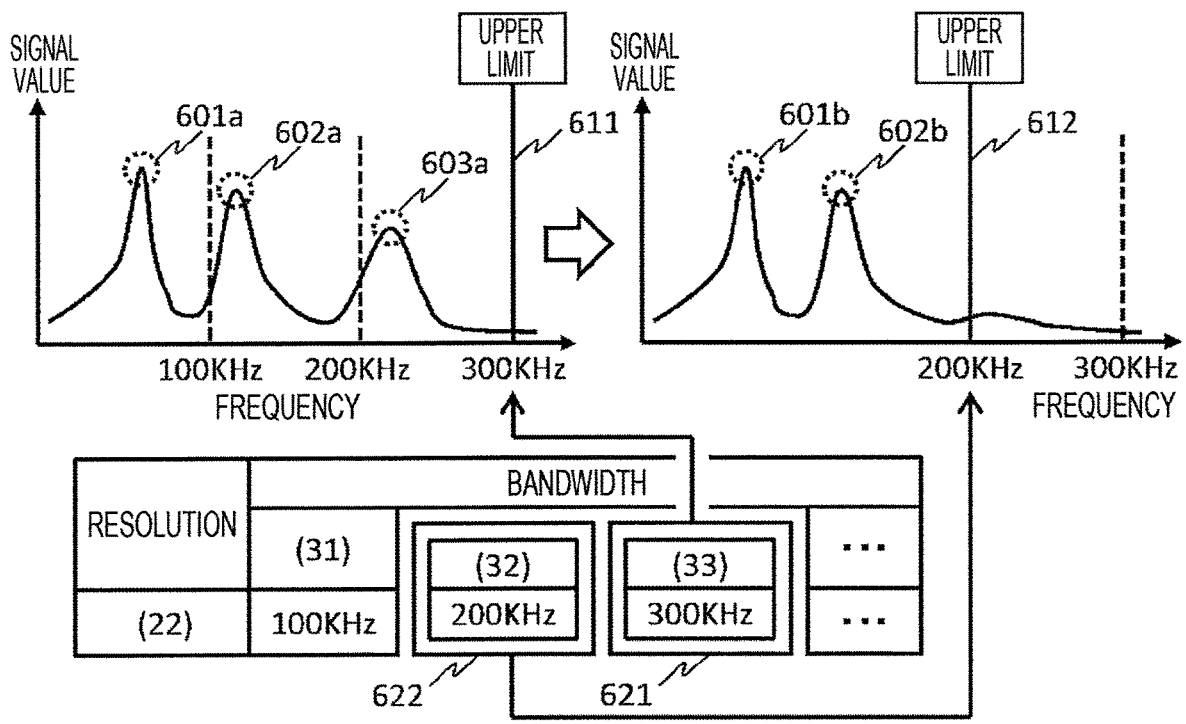
FIG. 6A is a diagram showing an example of a change in bandwidth characteristics.
Figure 6B:
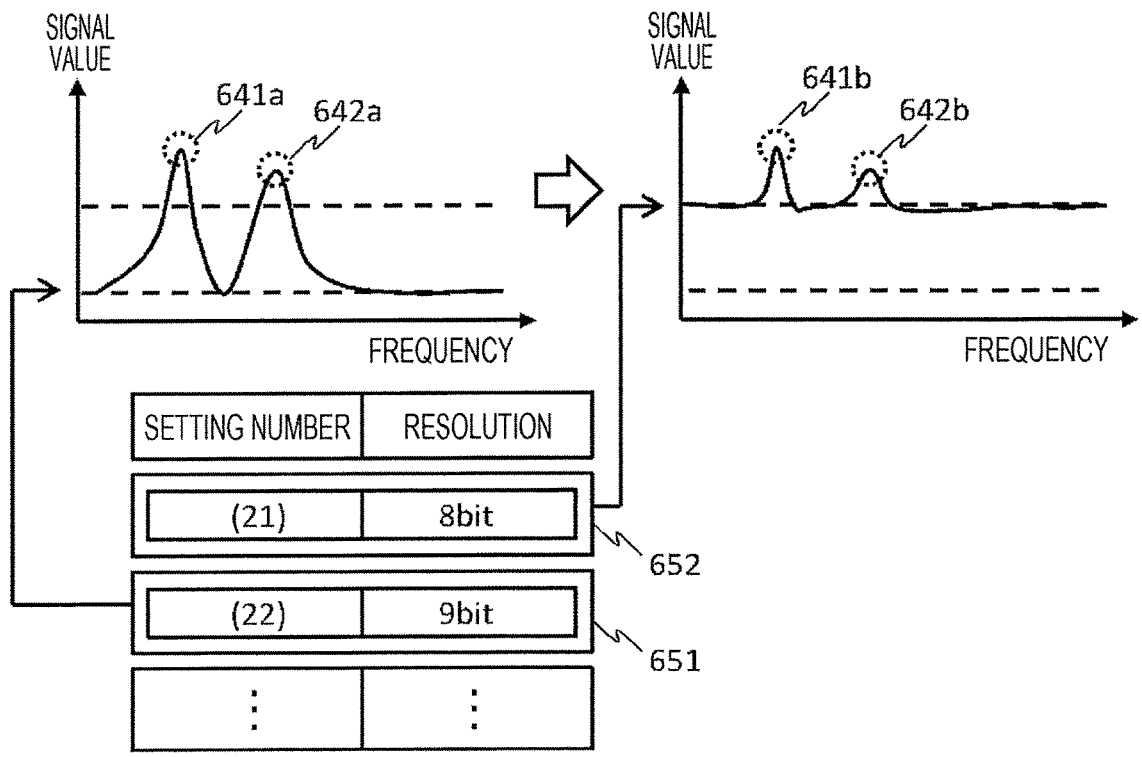
FIG. 6B is a diagram showing an example of a change in resolution characteristics.

FIGS. 6A and 6B are diagrams showing an example of setting change of the sensor terminal 100. An example of changing the characteristic of the bandwidth of the sensor terminal 100 will be described with reference to FIG. 6A. First, "(22)" is set as the resolution setting number and "(33)" is set as the bandwidth setting number. By these settings, "300 KHz" is the upper limit as in the bandwidth 621.

In these settings, for example, when a predetermined physical signal is input to the sensor terminal 100, a graph in which the signal value and the frequency are spectrally displayed as shown in FIG. 6A is obtained, and the bandwidth of the upper limit 611 includes signal peaks 601a, 602a, 603a.

Here, in the case where information on the signal peaks 601a, 602a is enough for specifying a predetermined physical signal, the signal peak 603a becomes unnecessary information, and as a graph, there is room for lowering the upper limit of the bandwidth of the sensor terminal 100.

The external control device 140 refers to the characteristic table shared with the sensor terminal 100, acquires a bandwidth 622 whose upper limit bandwidth is lower than that of the bandwidth 621, and instructs the sensor terminal 100 to set "(32)" as the bandwidth setting number. As a result, the upper limit 611 of the graph becomes the upper limit 612, and for the signal peaks 601a, 602a, the signals of the sensor terminal 100 remaining as the signal peaks 601b and 602b can be obtained.

By setting the bandwidth setting number to "(32)", that is, lowering the upper limit of the bandwidth from the upper limit 611 to the upper limit 612, it is possible to reduce the power consumption of the control circuit 110 as shown in FIG. 2E.

In order to instruct the setting of the setting number from the external control device 140 to the sensor terminal 100, the external control device 140 transmits a command code for setting (setting command) that is different from the command code shown in FIGS. 3A to 3C, the item number, and the setting number to the sensor terminal 100.

Next, an example of changing the characteristic of the resolution of the sensor terminal 100 will be described with reference to FIG. 6B. First, "(22)" is set as the resolution setting number, and "9 bits" corresponding to the resolution 651 is the resolution. In this settings, for example, when a predetermined physical signal is input to the sensor terminal 100, as similar to FIG. 6A, a graph in which the signal value and the frequency shown in FIG. 6B are spectrally displayed is obtained, and the signal peaks 641a, 642a are included.

Here, when information on the signal peaks 641a, 642a is enough for specifying a predetermined physical signal, there is room for lowering the resolution. The external control device 140 refers to the characteristic table shared with the sensor terminal 100, acquires resolution 652 lower than the resolution 651, and instructs the sensor terminal 100 to set "(21)" as the resolution setting number.

As a result, when, for the signal peaks 641a, 642a, the signals of the sensor terminal 100 remaining as the signal peaks 641b, 642b can be obtained, the resolution 652 thereof is maintained. By setting the resolution setting number to "(21)", it is possible to reduce the power consumption of the control circuit 110 as shown in FIG. 2E.

It should be noted that "(22)" may be set by transmission of the external control device 140 or may be set as the initial value of the sensor terminal 100. In the case where "(22)" is set by the transmission of the external control device 140, before the transmission, in order to share the characteristic table with the sensor terminal 100, the external control device 140 may transmit in advance the telegram that has been described with reference to FIGS. 3A to 3C to receive and store the information of the characteristic table.

As described above, the external control device 140 can acquire the characteristic table stored in the storage device 116 of the sensor terminal 100 and store the characteristic table in the storage device 143 of the external control device 140. As a result, even if the characteristic table is not set in advance in the external control device 140, the characteristic table can be shared between the sensor terminal 100 and the external control device 140 after the installation of the sensor terminal 100.

The external control device 140 transmits a setting number corresponding to the contents of the characteristic table, and the sensor terminal 100 changes the characteristic to a characteristic based on the received setting number, so that the performance can be suppressed and the operation power can be reduced.

Second Embodiment

In the first embodiment, an example of simply referring to the characteristic table has been described. In a second embodiment, an example of calibrating the content of a specific table will be described. FIG. 7 is a diagram showing an example of a sensor system including a sensor terminal 700 and the external control device 140 according to the second embodiment. The same reference numerals are given to the same circuits as those shown in FIG. 1, and the description thereof will be omitted.

The sensor terminal 700 is different from the sensor terminal 100 in a sensor element 720 and a control circuit 710. Like the sensor element 120, the sensor element 720 includes an element for converting a physical signal (physical phenomenon) into an electric signal, and includes, in addition to this element, an element for converting an electric signal into a physical signal. As a result, the electric signal can be fed back via the element included in the sensor element 720.

A digital-to-analog converter (DAC) 714 of the control circuit 710 is a circuit that converts a digital electric signal into an analog electric signal. The DAC 714 converts the digital value set by the operation and control device 117 into an analog electric signal and outputs the converted signal to a modulator 713.

The modulator 713 modulates the electrical signal output from the DAC 714 with the signal of the transmitter 114, and outputs the modulated signal to a driver 712. The driver 712 amplifies the modulated signal and outputs the amplified signal to an element of the sensor element 720 that converts the electrical signal into a physical signal. In this way, a physical signal detected by the sensor element 720 is generated in a pseudo manner.

In the sensor element 720, the converted physical signal is converted into an electric signal and output to the amplifier 111. A demodulator 711 of the control circuit 710 is a circuit that demodulates the modulated signal corresponding to the modulator 713.

On the basis of the control of the operation and control device 117, the DAC 714 and the modulator 713 sweep the frequency of the pseudo signal which is an electric signal for generating the physical signal in a pseudo manner, and the signal output from the ADC 113 and the pseudo signal (a signal for generating the pseudo signal) are compared, so that the frequency characteristic and the sensitivity information of the sensor terminal at each point of the sweep are specified.

Then, the operation and control device 117 compares the information specified by the sweep of the pseudo signal with the information already stored in the storage device 116, and when determining that the information is different on the basis of a preset threshold, rewrites the characteristic table corresponding to the information already stored in the storage device 116, stores the information specified by the sweep of the pseudo signal, and calibrates into the latest state.

When the element of the sensor element 720 converting the physical signal into an electric signal is a microphone or vibration sensor, the element of the sensor element 720 converting the electric signal into a physical signal may be a speaker or a vibration generating element. In this case, the modulator 713 may determine the intensity of sound or vibration on the basis of the output of the DAC 714 and perform modulation for determining the frequency of sound or vibration on the basis of the output of the transmitter 114.

As described above, according to the present embodiment, even if the circuit in the sensor terminal 700 changes with time, the sensor terminal 700 is calibrated and the characteristic table stored in the storage device 116 can be kept to the latest state.

What is claimed is:

1. A sensor terminal comprising:
   a sensor element;
   an ADC that converts an analog signal output from a sensor element into a digital signal;
   a storage device in which a plurality of first storage setting numbers being information for controlling the ADC and a plurality of pieces of first characteristic information including description of operation of the ADC are stored in association with each other; and
   a communication device that receives a first reception setting number from an outside of the sensor terminal and transmits the first characteristic information corresponding to the first storage setting number that coincides with the first reception setting number to the outside of the sensor terminal,
   wherein, in the storage device,
   a plurality of storage setting numbers and a plurality of pieces of characteristic information are stored in association with each other for each storage item number of a plurality of items including the plurality of first storage setting numbers and the plurality of pieces of the first characteristic information for a first storage item number of an item affecting the ADC, and
   the communication device receives a first reception item number and the first reception setting number from the outside of the sensor terminal, and transmits the first storage item number that coincides with the first reception item number and the first reception setting number, and the first characteristic information corresponding to the first storage setting number, to the outside of the sensor terminal.

2. The sensor terminal according to claim 1, wherein a plurality of pieces of the first characteristic information include information of a plurality of resolutions at which the ADC operates.

3. The sensor terminal according to claim 1, further comprising a filter that limits the analog signal output by the sensor element and outputs the analog signal that has been limited, to the ADC, wherein, in the storage device,
   a plurality of storage setting numbers and a plurality of pieces of characteristic information are stored in association with each other for each storage item number of a plurality of items further including a second storage setting number being information for controlling the filter, and a plurality of pieces of second characteristic information including description of operation of the filter for a second storage item number of an item affecting the filter, and
   the communication device receives a second reception item number and a second reception setting number from the outside of the sensor terminal, and transmits the second storage item number that coincides with the second reception item number and the second reception setting number, and the second characteristic information corresponding to the second storage setting number, to the outside of the sensor terminal.

4. The sensor terminal according to claim 3, wherein the plurality of pieces of the first characteristic information include information of a plurality of bandwidths that the filter limits.

5. The sensor terminal according to claim 3, wherein in the storage device,
   a plurality of storage item numbers and information on dependency relationships to other items are stored in association with each other, and
   the communication device receives a command to read an item from the outside of the sensor terminal and transmits the plurality of storage item numbers and the information on dependency relationships to other items associated with the plurality of storage item numbers to the outside of the sensor terminal.

6. The sensor terminal according to claim 5, wherein in the storage device,
   the plurality of item numbers and the information on dependency relationships to other items are stored in association with each other, including information that the second storage item number depends on the first storage item number.

7. The sensor terminal according to claim 6, wherein, in the storage device, the second characteristic information associated with the first storage setting number and the second storage setting number is stored.

8. The sensor terminal according to claim 7, wherein, the communication device, receives a command to read an item from the outside of the sensor terminal, transmits the plurality of storage item numbers including the second storage item number and the first storage item number, and the information on the dependency relationships to other items including the information that the second storage item number depends on the first storage item number to the outside of the sensor terminal, receives four numbers, that is, the first reception item number, the first reception setting number, the second reception item number, and the second reception setting number, from the outside of the sensor terminal, and transmits the second characteristic information associated with the first storage item number, the first storage setting number, the second storage item number, and the second storage setting number that coincide with the four numbers that have been received, to the outside of the sensor terminal.

9. The sensor terminal according to claim 8, wherein in the storage device, the plurality of storage item numbers and information on dependency relationships to other items are stored in association with each other, including information that the first storage item number is independent.

10. The sensor terminal according to claim 1, further comprising:

a control device that, in order to calibrate correspondence between the first storage setting number and the first characteristic information, inputs the digital signal converted by the ADC and outputs a digital signal to be compared; and a DAC that converts a digital signal output from the control device into an analog signal, wherein the sensor element converts the analog signal converted by the DAC into a physical signal, converts the converted physical signal into an analog signal, and outputs the analog signal to the ADC.

11. A sensor system comprising a sensor terminal and an external control device, the sensor terminal comprising:

a sensor element;

an ADC that converts an analog signal output from the sensor element into a digital signal;

a storage device in which a plurality of first storage setting numbers being information for controlling the ADC and a plurality of pieces of first characteristic information including description of operation of the ADC are stored in association with each other; and a communication device that receives a first reception setting number from the external control device and transmits the first characteristic information corresponding to the first storage setting number that coincides with the first reception setting number to the external control device, wherein the external control device transmits a first transmission setting number that is the same number as the first reception setting number, and receives the first characteristic information, and stores the first characteristic information.

12. The sensor system according to claim 11, wherein the communication device of the sensor terminal, upon receiving a command to read characteristics and the first reception setting number from the external control device, transmits the first characteristic information corresponding to the first storage setting number that coincides with the first reception setting number, to the external control device, and upon receiving a setting command and the first reception setting number from the external control device, transmits the digital signal converted by the ADC operated with the first reception setting number encoded, to the external control device, and the external control device transmits the command to read characteristics and a plurality of the first transmission setting numbers to the sensor terminal, receives and stores a plurality of pieces of the first characteristic information corresponding to the plurality of the first transmission setting number, transmits a third number among the plurality of the first transmission setting number and the setting command, receives the digital signal converted by the ADC operated with the third number encoded, as a fourth number that does not impair waveform information of the received digital signal, transmits the fourth number among the plurality of the first transmission setting number, and the setting command, and receives the digital signal converted by the ADC operated with the fourth number converted.

13. The sensor system according to claim 12, wherein the plurality of the first characteristic information include information of a plurality of resolutions operated by the ADC, and the information on the resolution included in the fourth number is information with a lower resolution than that of the information on the resolution included in the third number.

* * * * *